United States Patent
Feng et al.

(10) Patent No.: US 9,522,823 B2
(45) Date of Patent: Dec. 20, 2016

(54) APPARATUS FOR CUTTING TRANSMISSION ELECTRON MICROSCOPE MICRO-GRIDS

(71) Applicants: Tsinghua University, Beijing (CN); HON HAI PRECISION INDUSTRY CO., LTD., New Taipei (TW)

(72) Inventors: Chen Feng, Beijing (CN); Xue-Wei Guo, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 283 days.

(21) Appl. No.: 13/729,425

(22) Filed: Dec. 28, 2012

(65) Prior Publication Data

US 2013/0256361 A1  Oct. 3, 2013

(30) Foreign Application Priority Data

Apr. 3, 2012  (CN) .......................... 2012 1 0095724

(51) Int. Cl.
*B26F 1/02* (2006.01)
*B81C 1/00* (2006.01)
*H01J 37/20* (2006.01)

(52) U.S. Cl.
CPC ............ B81C 1/00436 (2013.01); B26F 1/02 (2013.01); H01J 37/20 (2013.01); *Y10T 225/393* (2015.04)

(58) Field of Classification Search
CPC .......... B26F 1/02; B81C 1/00436; H01J 37/20
USPC .......... 83/123–128, 136, 138–143, 658, 914; 225/100–106
See application file for complete search history.

(56) References Cited

U.S. PATENT DOCUMENTS

| | | | | |
|---|---|---|---|---|
| 4,131,042 A | * | 12/1978 | Rich et al. | ....................... 83/100 |
| 4,543,865 A | * | 10/1985 | Kramski | .............. B21D 28/145 |
| | | | | 83/146 |
| 5,479,687 A | * | 1/1996 | Sawdon | ...................... 29/243.5 |
| 6,161,279 A | * | 12/2000 | Suboski | .......................... 29/798 |
| 6,397,715 B1 | * | 6/2002 | Roberts | .......................... 83/149 |
| 7,610,789 B1 | * | 11/2009 | Liu et al. | ......................... 72/384 |
| 2009/0317926 A1 | | 12/2009 | Zhang et al. | |

FOREIGN PATENT DOCUMENTS

| | | | | |
|---|---|---|---|---|
| CN | 101081530 | | 12/2007 | |
| GB | 712615 A | * | 7/1954 | ............... B26F 1/36 |
| TW | 201003712 | | 1/2010 | |

* cited by examiner

*Primary Examiner* — Kenneth E. Peterson
*Assistant Examiner* — Nhat Chieu Do
(74) *Attorney, Agent, or Firm* — Zhigang Ma

(57) ABSTRACT

An apparatus for cutting micro-grids from a metal substrate is provided. The apparatus includes a support and a cutting module. The support includes a supporting surface, the support is configured to support a micro-grid and the metal substrate. The cutting module includes a fixing element, a spring and a cutting structure. The fixing structure and the spring are located in the cutting structure. The fixing element is configured to fix the micro-grid on the supporting surface. The cutting structure is configured to cut the micro-grid from the metal substrate.

19 Claims, 7 Drawing Sheets

APPARATUS FOR CUTTING TRANSMISSION ELECTRON MICROSCOPE MICRO-GRIDS

RELATED APPLICATIONS

This application claims all benefits accruing under 35 U.S.C. §119 from China Patent Application No. 201210095724.X, filed on Apr. 3, 2012, in the China Intellectual Property Office, the disclosure of which is incorporated herein by reference. The application is also related to copending applications entitled, "METHOD FOR CUTTING TRANSMISSION ELECTRON MICROSCOPE MICRO-GRIDS", filed on Dec. 28, 2012 Ser. No. 13/729,433.

BACKGROUND

1. Technical Field

The present disclosure relates to a method for cutting transmission electron microscope micro-grids.

2. Description of Related Art

In a transmission electron microscope, a porous micro-grid is used to carry powder samples to observe high resolution transmission electron microscopy (TEM) images. With the development of nanotechnology, applications of micro-grids become increasingly widespread in the field of electron microscopy. A conventional micro-grid has a round structure with a diameter about 3 millimeters. A plurality of micro-grids is formed on a metal substrate simultaneously. When the micro-grid is used, it should be separated from the metal substrate. Because the micro-grid has a small size, it may be difficult to separate the micro-grid from the metal substrate without causing damages to the micro-grid.

What is needed, therefore, is to provide a method for cutting micro-grids from metal substrate.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

A method for cutting micro-grids from a metal substrate is provided according to one embodiment. The method includes the following steps:

S1: providing a metal substrate with a plurality of micro-grids formed on the metal substrate;

S2: providing a cutting apparatus including a support, a cutting module and a catching module;

S3: laying the metal substrate on the support, moving the cutting module above the metal substrate to make one micro-grid between the support and the cutting module; and S4: moving the cutting module towards the support to cut the micro-grid off the metal substrate, and catching the micro-grid with the catching module.

Figure 1:
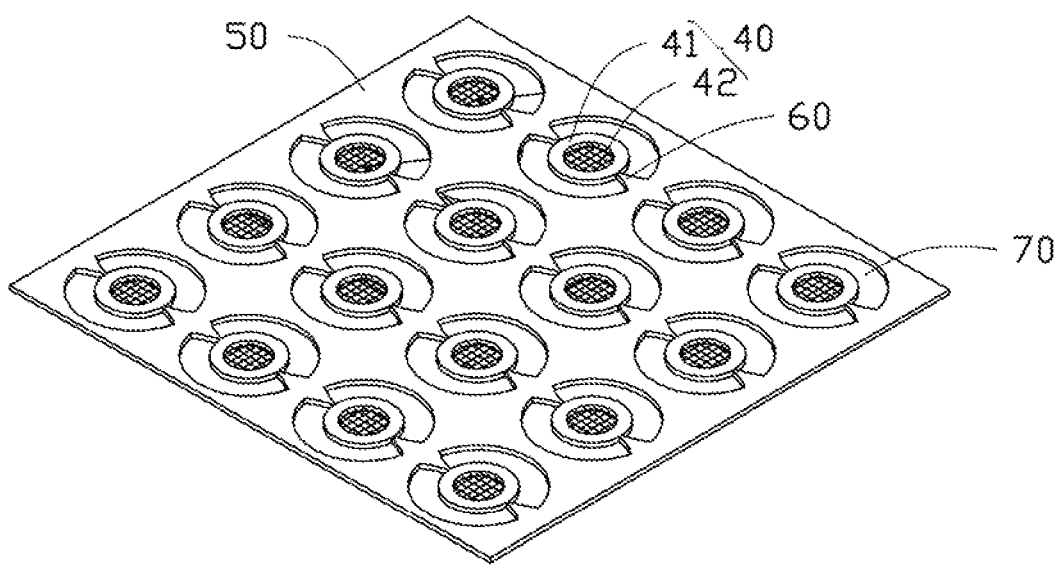
FIG. 1 is schematic view of a plurality of micro-grids formed on a metal substrate.

In step S1, referring to FIG. 1, a plurality of micro-grids 40 are formed on a metal substrate 50. The metal substrate 50 defines a plurality of holes 70. The micro-grids 40 and the plurality of holes 70 are arranged in a one by one manner. Each of the micro-grids 40 is suspended in one hole and connected with the metal substrate 50 via two connections 60. Each of the two connections 60 connects with each of the micro-grids 40 via a point contact, and with the metal substrate 50 via a linear contact. In the embodiment according to FIG. 1, each of the connections 60 has a triangular structure. One corner of each of the connections 60 is connected with the micro-grid, and a side of each of the connections 60 opposite with the corner is connected with the metal substrate 50. Each of the micro-grids 40 includes a bridge ring 41 and a grid structure 42. The grid structure 42 is located in the bridge ring 41.

Figure 2:
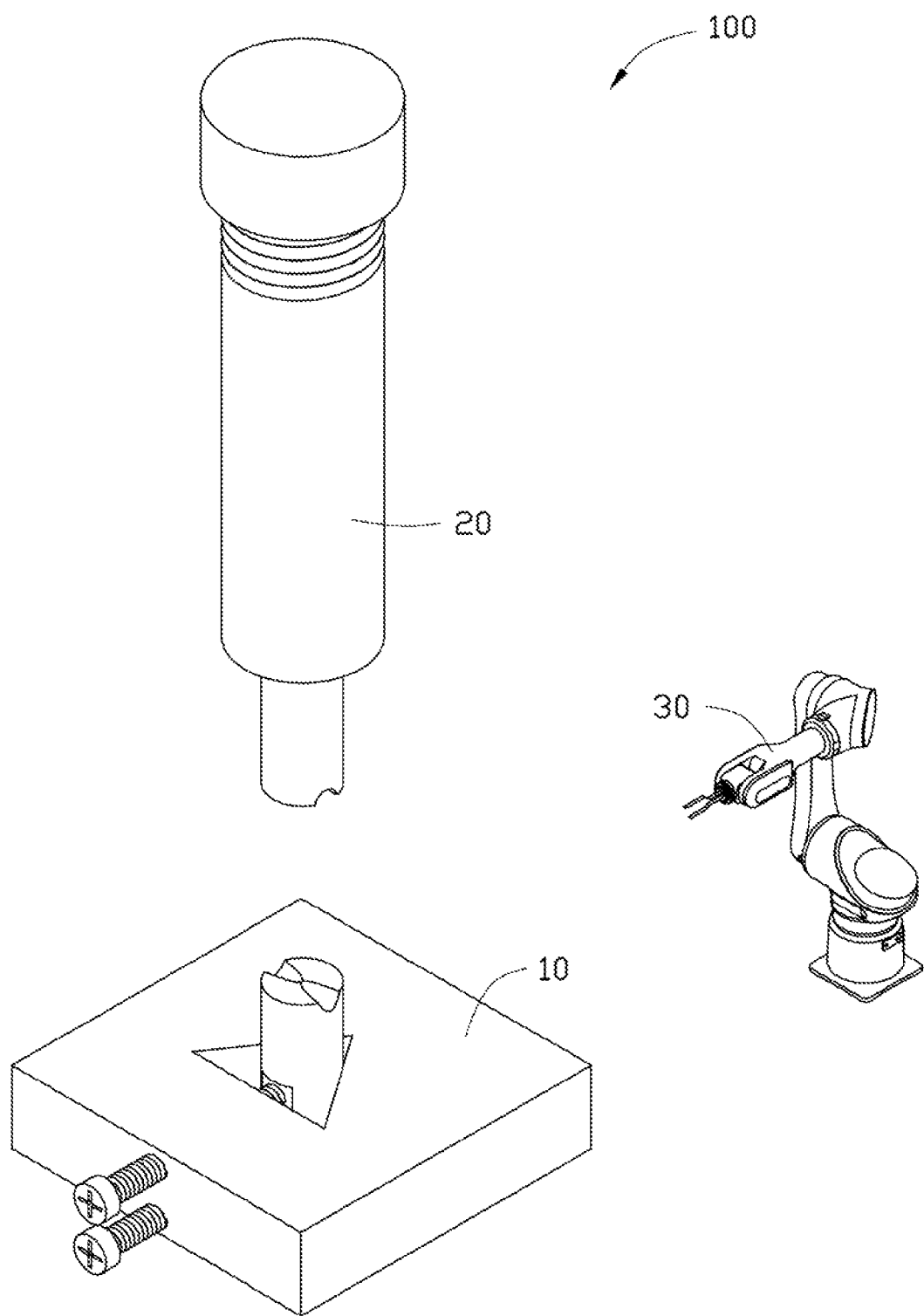
FIG. 2 is a schematic view of an embodiment of a cutting apparatus for cutting micro-grids.

In step S2, referring to FIG. 2, the cutting apparatus 100 is configured to cutting the micro-grids 40 from the metal substrate 50. The cutting apparatus 100 includes a support 10, a cutting module 20 and a catching module 30. The support 10 is configured to support the metal substrate 50. The cutting module 20 is used to cutting the micro-grids 40 from the metal substrate 50.

Figure 3:
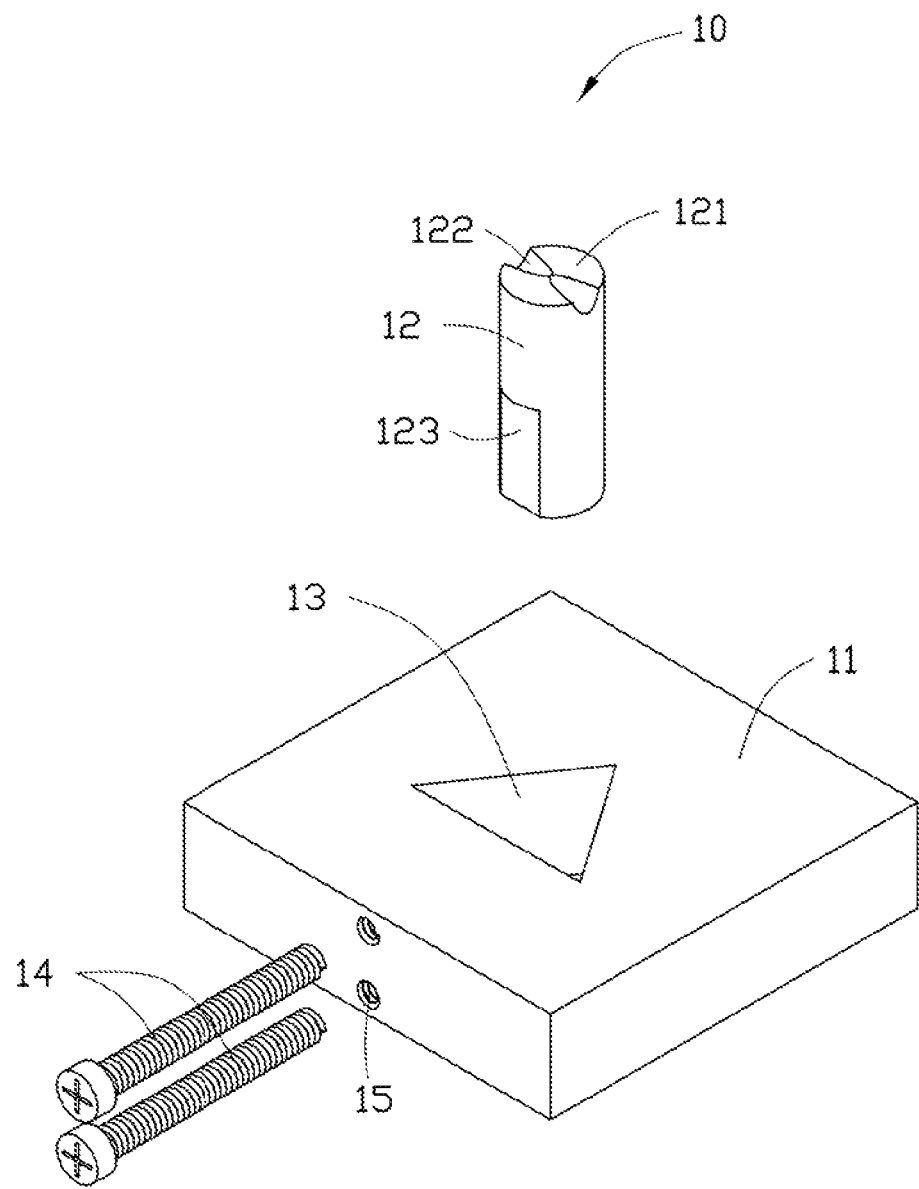
FIG. 3 is an exploded schematic view of a support used in the cutting apparatus in FIG. 2.
Figure 7:
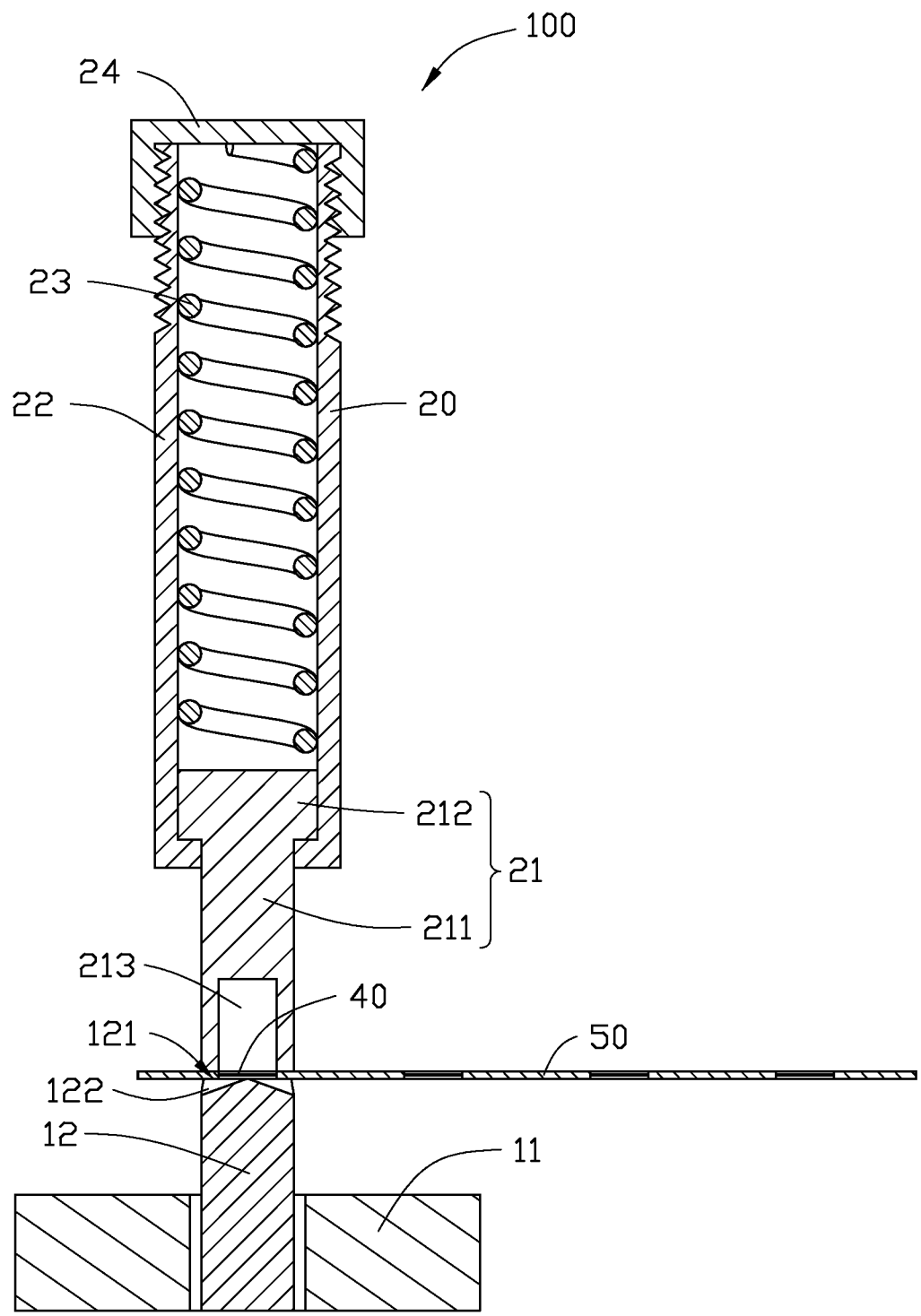
FIG. 7 is a cross sectional view of FIG. 6 along line VII-VII.

Referring to FIG. 3, the support 10 includes a bottom 11 and a cylindrical holder 12. The holder 12 can be fixed on the bottom 11 by mechanical method or adhesive. In one embodiment according to FIG. 3, the bottom 11 defines a through hole 13, the holder 12 is inserted to the through hole 13. The holder 12 defines a planar surface 123. The planar surface 123 contacts a side surface of the through hole 13, and the holder 12 is fixed on the bottom 11 via two screws 14. The two screws 14 are inserted into the bottom 11 through two screw threads 15. In one embodiment, the holder 12 is a solid structure, as shown in FIG. 7.

The cylindrical holder 12 includes a supporting body 121 to support the micro-grids 40. The supporting body 121 has a round structure. A diameter of the supporting body 121 is greater than or equal to a diameter of each of the micro-grids 40. The supporting body 121 defines two grooves 122 at its top surface. The two grooves 122 are opposite with each other. A shape of the grooves 122 is not limited, it can be cylinder or square. In another embodiment, the supporting body 121 can define one square groove passing through the top surface thereof.

Figure 4:
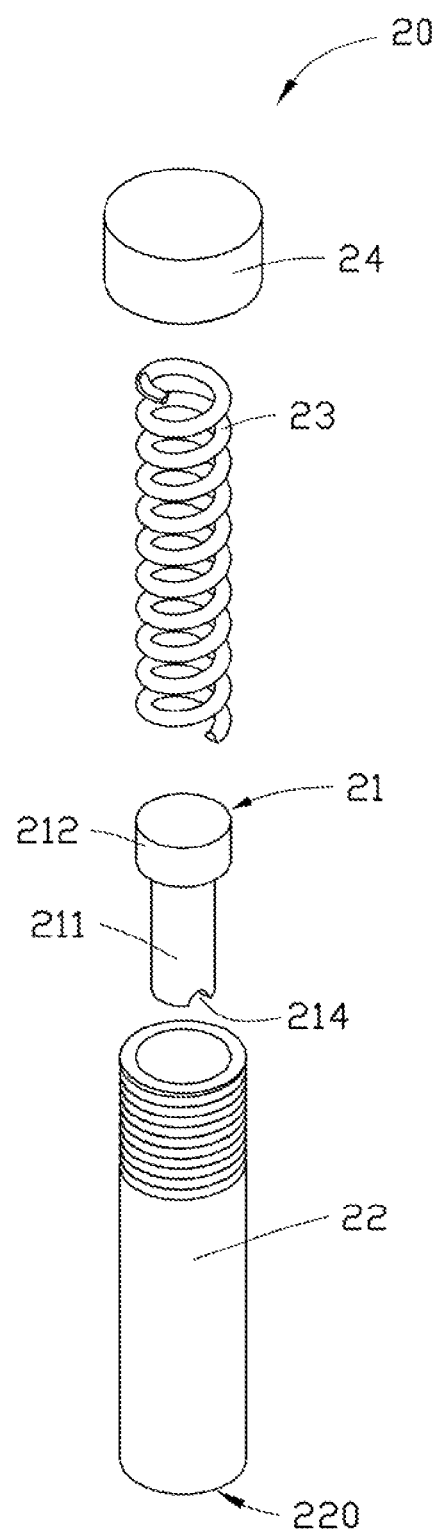
FIG. 4 is an exploded schematic view of a cutting module in the cutting apparatus in FIG. 2.
Figure 5:
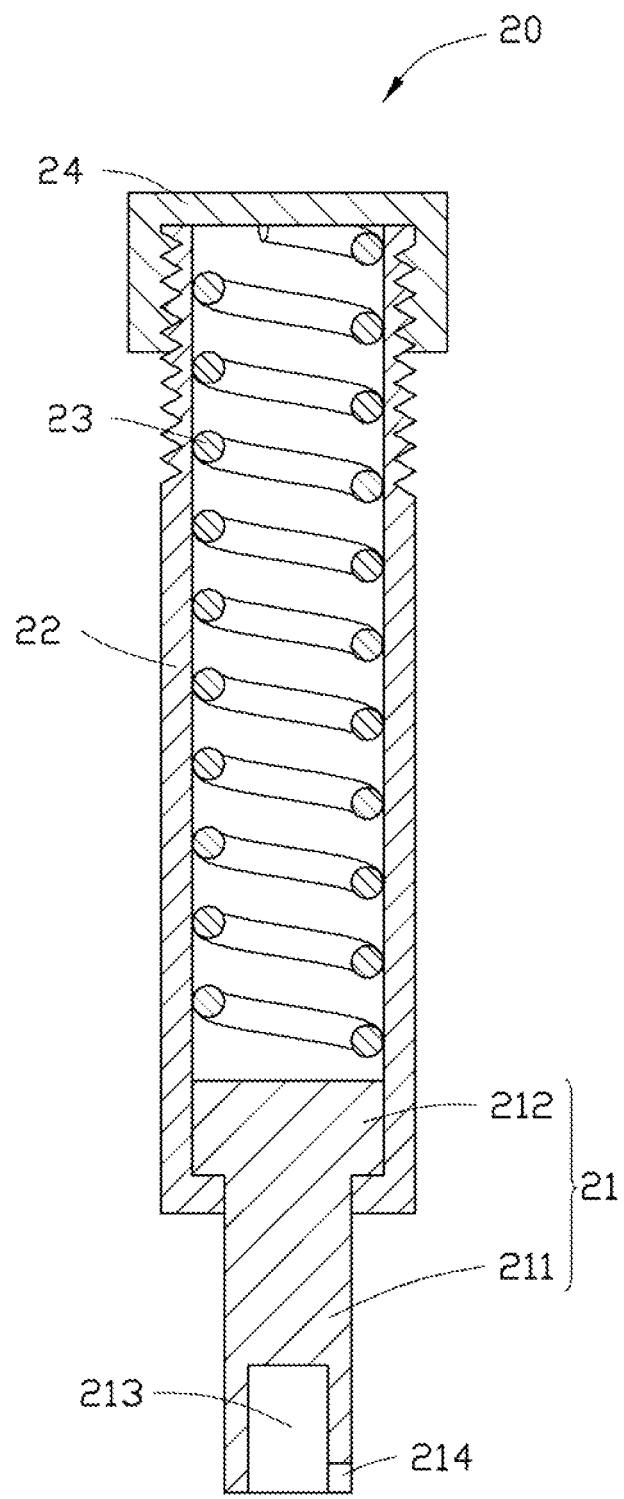
FIG. 5 is a cross sectional view of the cutting module in FIG. 4.

Referring to FIGS. 4 and 5, the cutting module 20 includes a fixing element 21, a cutting structure 22, a spring 23 and a screw nut 24. The fixing element 21 has a pin structure and includes a head 212 and a column 211 extending downwardly from the head 212. The column 211 and the head 212 are coaxial. A diameter of the column 211 is smaller than that of the head 212, and a step is defined by the combining surface of the column 211 and the head 212. The column 211 defines a cylindrical hole 213 at its free end. The cylindrical hole 213 and the head 212 are coaxial. A diameter of the cylindrical hole 213 is greater than the diameter of the grid structure 42 and smaller than or equal to a diameter of each of the micro-grids 40. A diameter of the column 211 is almost the same as the diameter of each of the micro-girds 40. A cutout 214 can be defined in the portion of the column 211 which defines the cylindrical hole 213. The cutout 214 is communicated with the cylindrical hole 213. The spring 23 is located on a surface of the head 212 and abuts the surface of the head 212. The head 212 is integrated with the column 211. A cutout 214 is defined in a lateral side of the column 211.

The cutting structure 22 has a tube structure defining an open 220 at one free end thereof. The cutting structure 22 defines a cylindrical through hole. A diameter of the open 220 is smaller than that of the through hole, whereby a step is formed at the open 220. The diameter of the through hole is matched with a diameter of the head 212. The diameter of the open 220 is matched with the column 211. The fixing element 21 can extend through the cutting structure 22 from the cylindrical through hole such that the head 212 of the fixing element 21 is kept by the open 220. The diameter of the open 220 is almost the same as that of the cylindrical holder 12. The diameter of the open 220 is a little greater than the diameter of each of the micro-grids 40. A screw thread is formed at one end of the cutting structure 22. The screw thread is engaged with the screw nut 24.

The fixing element 21 extends through the through hole of the cutting structure 22 such that the column 211 extends out of the cutting structure 22 from the open 220. The head 212 is kept by the open 220 of the cutting structure 22. The spring 23 is located in the through hole of the cutting structure 22. The screw nut 24 is engaged with the cutting structure 22 via the screw thread. One end of the spring 23 connects with the screw nut 24, the other end of the spring 23 connects with the fixing element 21. The fixing element 21 can move freely in the through hole of the cutting structure 22 via the spring 23.

The catching module 30 is used to catch each of the micro-grids 40 after it is separated from the metal substrate 50. The catching module 30 includes a clamp. The clamp can catch each of the micro-grids 40 through the cutout 214, and then move each of the micro-grids 40.

Figure 6:
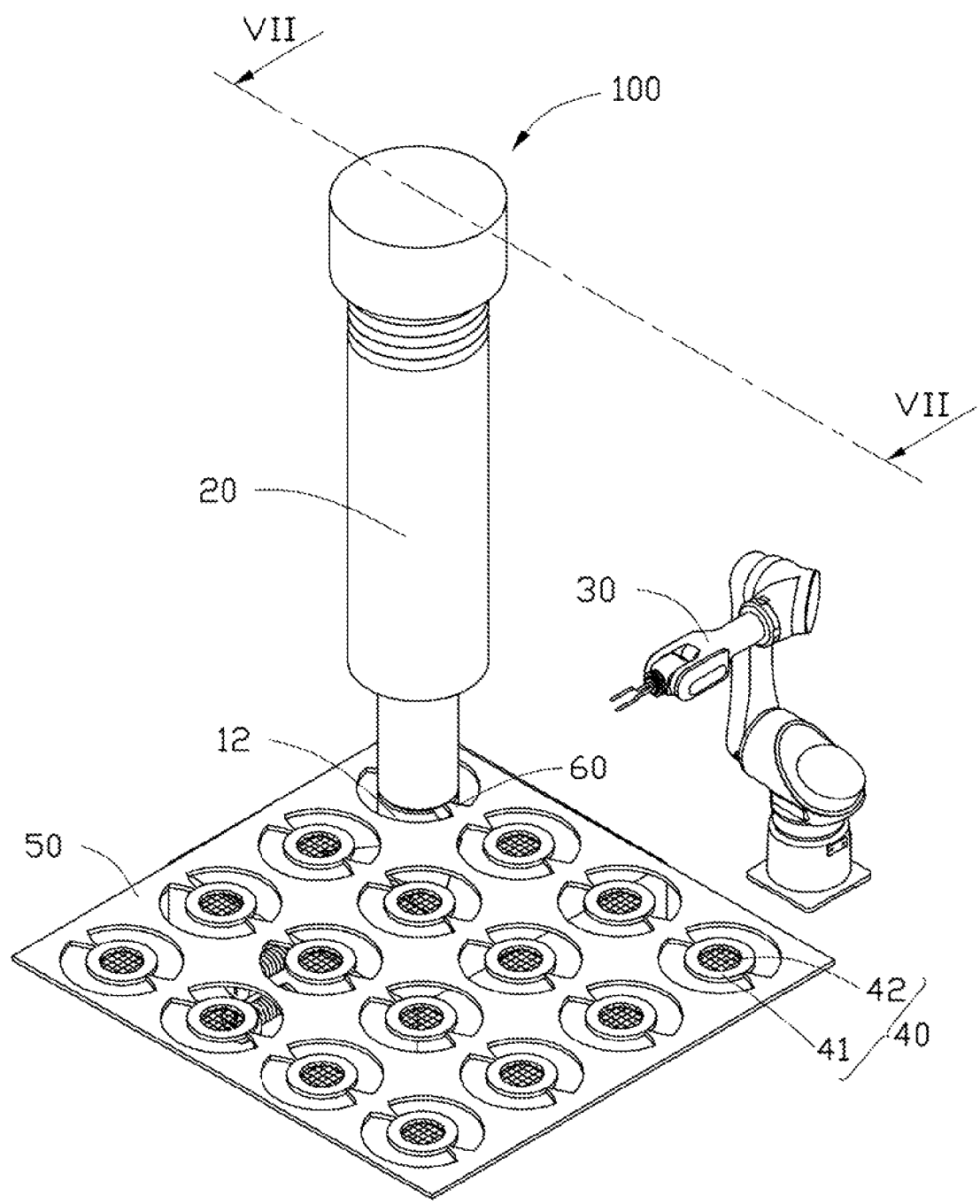
FIG. 6 is a schematic view showing the cutting apparatus cutting micro-grids.

In step S3, referring to FIGS. 6 and 7, one of the micro-grids 40 is located on the top surface of the supporting body 121. The two connections 60 are separately hung above the grooves 122 on the top surface of the supporting body 121. The cutting module 20 is moved above the micro-grids 40, thereby the fixing element 21 is opposite to the micro-grids 40. The cylindrical hole 213 faces the grid structure 42 of each of the micro-grids 40, because the diameter of the cylindrical hole 213 is greater than that of the grid structure 42, the grid structure 42 is located in the cylindrical hole 213, in case that the grid structure 42 is destroyed by the cutting module 20. One of the micro-grids 40 is located between the fixing element 21 and the top surface of the supporting body 121, and is fixed on the supporting body 121 by the fixing element 21.

In step S4, the screw nut 24 is pressed down, the fixing element 21 shrinks into the through hole of the cutting structure 22, and the spring 23 makes the cutting structure 22 move towards one of the micro-grids 40. Then, the cutting structure 22 contacts the connections 60, and makes the connections 60 deform under a pressing force of the cutting structure 22. Then, the connections 60 are stretched by the pressing force, the point contact between each of the micro-grids 40 and each of the connections 60 is disconnected, and each of the micro-grids 40 is separated from the connections. Thus, each of the micro-grids 40 is cut down from the metal substrate 50. Because the connections 60 are suspended above the grooves 122, a cutting speed can be slowed by the grooves 122, in case that the micro-grids 40 are destroyed by a high speed.

In step S4, after each of the micro-grids 40 is separated from the metal substrate 50, the clamp can catch each of the micro-grids 40 through the cutout 214, and then move each of the micro-grids 40. The clamp catches the bridge ring 41 of the micro-grid, in case that the grid structure 42 is destroyed by the clamp. The micro-grids 40 can be put into a box.

The method for cutting micro-grids from a metal substrate can be easily operated. The cutting apparatus has a simple structure. When the cutting apparatus is used to cutting the micro-grids from the metal substrate, the micro-grids can be separated from the metal substrate easily without destroy the micro-grids.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure. Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. An apparatus for cutting micro-grids from a metal substrate comprising:
   a support comprising a cylindrical holder configured to support a micro-grid and the metal substrate; wherein the cylindrical holder has a top surface, two grooves located on the top surface of the cylindrical holder, and the two grooves are located opposite each other; and
   a cutting module comprising:
     a cutting structure defining a through hole having a first end and a second end opposite to the first end, an inner diameter of the through hole is greater than an outer diameter of the cylindrical holder;
     a screw nut engaged with the first end of the through hole, the screw nut closing the through hole;
     a spring located in the through hole; and
     a fixing element comprising a head received in the through hole and a column extending from the second end of the through hole and out of the through hole, the column defines a cylindrical hole, and the cylindrical hole is enclosed on all sides except for one;
   wherein the spring is between the head and the screw nut.

2. The apparatus of claim 1, wherein the cylindrical holder is fixed relative to the support.

3. The apparatus of claim 1, wherein the cylindrical holder is fixed relative to the micro-grid and the metal substrate.

4. The apparatus of claim 1, wherein the cylindrical holder is a solid structure.

5. The apparatus of claim 1, wherein the support further comprises a bottom defining a hole, the cylindrical holder is configured to be inserted into the hole and fixed on the bottom.

6. The apparatus of claim 5, wherein the cylindrical holder defines a planar surface contacting with a side surface of the hole, the cylindrical holder is fixed on the bottom via two screws, and the two screws are inserted into the bottom through two screw threads.

7. The apparatus of claim 1, wherein the micro-grid comprises a bridge ring and a grid structure located in the bridge ring, and a diameter of the cylindrical hole is greater than a diameter of the grid structure and smaller than a diameter of the micro-grid.

8. The apparatus of claim 1, wherein a cutout is defined only in a portion of the column away from the through hole.

9. The apparatus of claim 1, wherein the column and the head are coaxial, and a diameter of the column is smaller than a diameter of the head.

10. The apparatus of claim 1, wherein the spring comprises a spring first end and a spring second end opposite to the spring first end, the spring first end of the spring contacts with the screw nut, and the spring second end of the spring contacts with the head of the fixing element.

11. The apparatus of claim 1, wherein the support further comprises a bottom, and the cylindrical holder is secured to the bottom.

12. The apparatus of claim 1, wherein the spring is located on a surface of the head and abuts the surface of the head, and the head is integrated with the column.

13. An apparatus for cutting micro-grids from a metal substrate comprising:
   a support comprising a cylindrical holder configured to support a micro-grid and the metal substrate; wherein the cylindrical holder has a top surface, two grooves located on the top surface of the cylindrical holder, and the two grooves are located opposite each other; and
   a cutting module comprising:
      a cutting structure defining a through hole having a first end and a second end opposite to the first end, an inner diameter of the through hole is greater than an outer diameter of the cylindrical holder;
      a screw nut engaged with the first end of the through hole, the screw nut closing the through hole;
      a spring located in the through hole; and
      a fixing element comprising a head received in the through hole and a column extending from the second end of the through hole and out of the through hole, the column defines a cylindrical hole; the micro-grid comprises a bridge ring and a grid structure located in the bridge ring, and a diameter of the cylindrical hole is greater than a diameter of the grid structure and smaller than a diameter of the micro-grid; the cylindrical hole is enclosed on all sides except for one, and a cutout is defined in a lateral side of the column and is away from the through hole.

14. The apparatus of claim 13, wherein the cylindrical holder is fixed relative to the micro-grid and the metal substrate.

15. The apparatus of claim 13, wherein the cylindrical holder is a solid structure.

16. The apparatus of claim 13, wherein the support further comprises a bottom defining a hole, the cylindrical holder is configured to be inserted into the hole and fixed on the bottom.

17. The apparatus of claim 16, wherein the cylindrical holder defines a planar surface contacting with a side surface of the hole, the cylindrical holder is fixed on the bottom via two screws, and the two screws are inserted into the bottom through two screw threads.

18. The apparatus of claim 13, wherein the column and the head are coaxial, and a diameter of the column is smaller than a diameter of the head.

19. The apparatus of claim 13, wherein the spring comprises a spring first end and a spring second end opposite to the spring first end, the spring first end of the spring contacts with the screw nut, and the spring second end of the spring contacts with the head of the fixing element.

* * * * *